United States Patent
Yang et al.

(10) Patent No.: US 12,132,111 B2
(45) Date of Patent: Oct. 29, 2024

(54) FORMATION METHOD OF SEMICONDUCTOR DEVICE STRUCTURE WITH GATE STACKS

(71) Applicant: TAIWAN SEMICONDUCTOR MANUFACTURING CO., LTD., Hsinchu (TW)

(72) Inventors: Ya-Wen Yang, Xiushui Township, Changhua County (TW); Tsung-Yu Chiang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 243 days.

(21) Appl. No.: 16/936,921

(22) Filed: Jul. 23, 2020

(65) Prior Publication Data
US 2020/0357912 A1 Nov. 12, 2020

Related U.S. Application Data

(62) Division of application No. 15/183,021, filed on Jun. 15, 2016, now Pat. No. 10,734,522.

(51) Int. Cl.
| H01L 29/78 | (2006.01) |
| H01L 21/8234 | (2006.01) |
| H01L 27/088 | (2006.01) |
| H01L 29/06 | (2006.01) |
| H01L 29/49 | (2006.01) |
| H01L 29/66 | (2006.01) |

(52) U.S. Cl.
CPC .... *H01L 29/785* (2013.01); *H01L 21/823431* (2013.01); *H01L 27/0886* (2013.01); *H01L 29/0649* (2013.01); *H01L 29/4916* (2013.01); *H01L 29/66795* (2013.01)

(58) Field of Classification Search
CPC ........... H01L 29/785; H01L 21/823431; H01L 27/0886; H01L 29/0649; H01L 29/4916; H01L 29/66795
See application file for complete search history.

(56) References Cited

U.S. PATENT DOCUMENTS

| 7,425,740 | B2 | 9/2008 | Liu et al. |
| 8,048,723 | B2 | 11/2011 | Chang et al. |
| 8,053,299 | B2 | 11/2011 | Xu |
| 8,183,627 | B2 | 5/2012 | Currie |
| 8,415,718 | B2 | 4/2013 | Xu |
| 8,497,177 | B1 | 7/2013 | Chang et al. |
| 8,551,843 | B1 * | 10/2013 | Cai ......................... H01L 29/78 438/294 |

(Continued)

FOREIGN PATENT DOCUMENTS

JP 5-347415 A 12/1993

*Primary Examiner* — Benjamin Tzu-Hung Liu
(74) *Attorney, Agent, or Firm* — Birch, Stewart, Kolasch & Birch, LLP

(57) ABSTRACT

A method for forming a semiconductor device structure is provided. The method includes forming a first gate stack and a second gate stack over a semiconductor substrate and forming a dielectric layer over the semiconductor substrate to surround the first gate stack and the second gate stack. The method also includes forming a protection element to cover the second gate stack. The method further includes replacing the first gate stack with a metal gate stack after the formation of the protection element.

20 Claims, 5 Drawing Sheets

(56) References Cited

U.S. PATENT DOCUMENTS

| | | | |
|---|---|---|---|
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 9,478,625 B1 * | 10/2016 | Zang | H01L 27/1211 |
| 9,570,571 B1 * | 2/2017 | Basker | H01L 29/0649 |
| 9,583,499 B1 * | 2/2017 | Zhu | H01L 21/32139 |
| 10,074,726 B2 * | 9/2018 | You | H01L 21/823821 |
| 2013/0043535 A1 * | 2/2013 | Anderson | H01L 21/84 |
| | | | 257/E21.546 |
| 2013/0285153 A1 | 10/2013 | Lee et al. | |
| 2014/0021517 A1 | 1/2014 | Cheng et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2015/0115363 A1 | 4/2015 | Chang et al. | |
| 2015/0115373 A1 * | 4/2015 | Yu | H01L 29/66545 |
| | | | 438/283 |
| 2015/0263003 A1 | 9/2015 | Lee et al. | |
| 2017/0117187 A1 * | 4/2017 | Ando | H01L 29/66545 |

* cited by examiner

FORMATION METHOD OF SEMICONDUCTOR DEVICE STRUCTURE WITH GATE STACKS

PRIORITY CLAIM AND CROSS-REFERENCE

This application is a Divisional of U.S. application Ser. No. 15/183,021, filed on Jun. 15, 2016, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

Despite groundbreaking advances in materials and fabrication, scaling planar devices such as a metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). A FinFET is fabricated with a thin vertical "fin" (or fin structure) extending up from a substrate. The channel of the FinFET is formed in this vertical fin. A gate is provided over the fin to allow the gate to control the channel from multiple sides. The advantages of a FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including a FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
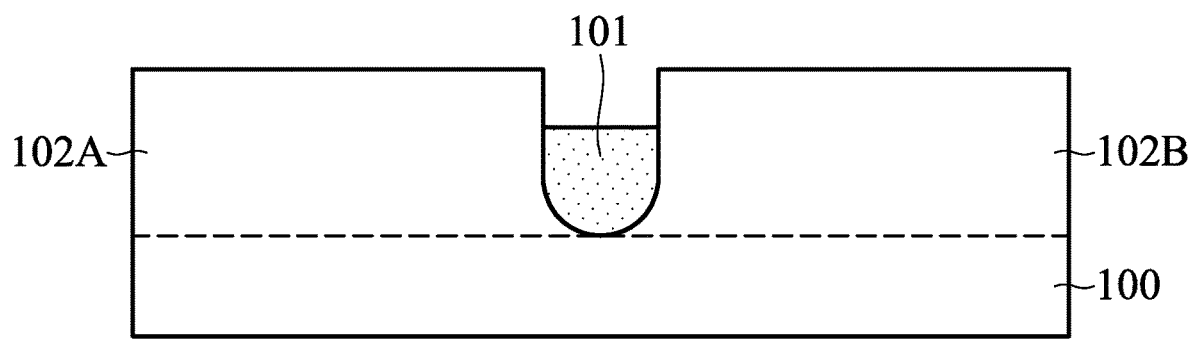
FIGS. 1A-1E are cross-sectional views of various stage of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a semiconductor device structure, in accordance with some embodiments. As shown in FIG. 1A, multiple fin structures including fin structures 102A and 102B are formed over a semiconductor substrate 100, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, multiple recesses (or trenches) are formed in the semiconductor substrate 100. As a result, multiple fin structures including the fin structures 102A and 102B are formed between the recesses. In some embodiments, one or more photolithography and etching processes are used to form the recesses.

As shown in FIG. 1A, isolation structures including an isolation structure 101 are formed in the recesses to surround lower portions of the fin structures including the fin structures 102A and 102B, in accordance with some embodiments. The isolation structure 101 is adjacent to the fin structures 102A and 102B. In some embodiments, the isolation structure 101 continuously surrounds the lower portions of the fin structures 102A and 102B. The isolation structure 101 is used to define and electrically isolate various device elements formed in and/or over the semiconductor substrate 100. In some embodiments, the isolation structure 101 includes a shallow trench isolation (STI) feature, a local oxidation of silicon (LOCOS) feature, another suitable isolation structure, or a combination thereof.

In some embodiments, the isolation structure 101 has a multi-layer structure. In some embodiments, the isolation structure 101 is made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation structure 101. The STI liner may also be used to reduce crystalline defects at the interface between the fin structures and the isolation structure 101.

In some embodiments, a dielectric material layer is deposited over the semiconductor substrate 100. The dielectric material layer covers the fin structures including the fin structures 102A and 102B and fills the recesses between the fin structures. In some embodiments, a planarization process is performed to thin down the dielectric material layer. For example, the dielectric material layer is thinned until the fin structures 102A and 102B are exposed. The planarization process may include a chemical mechanical polishing (CMP) process, a grinding process, a dry polishing process, an etching process, another applicable process, or a combination thereof. Afterwards, the dielectric material layer is etched back to be below the top of the fin structures 102A and 102B. As a result, the isolation structure 101 is formed. The fin structures 102A and 102B protrude from the top surface of the isolation structure 101, as shown in FIG. 1A in accordance with some embodiments.

Figure 1B:
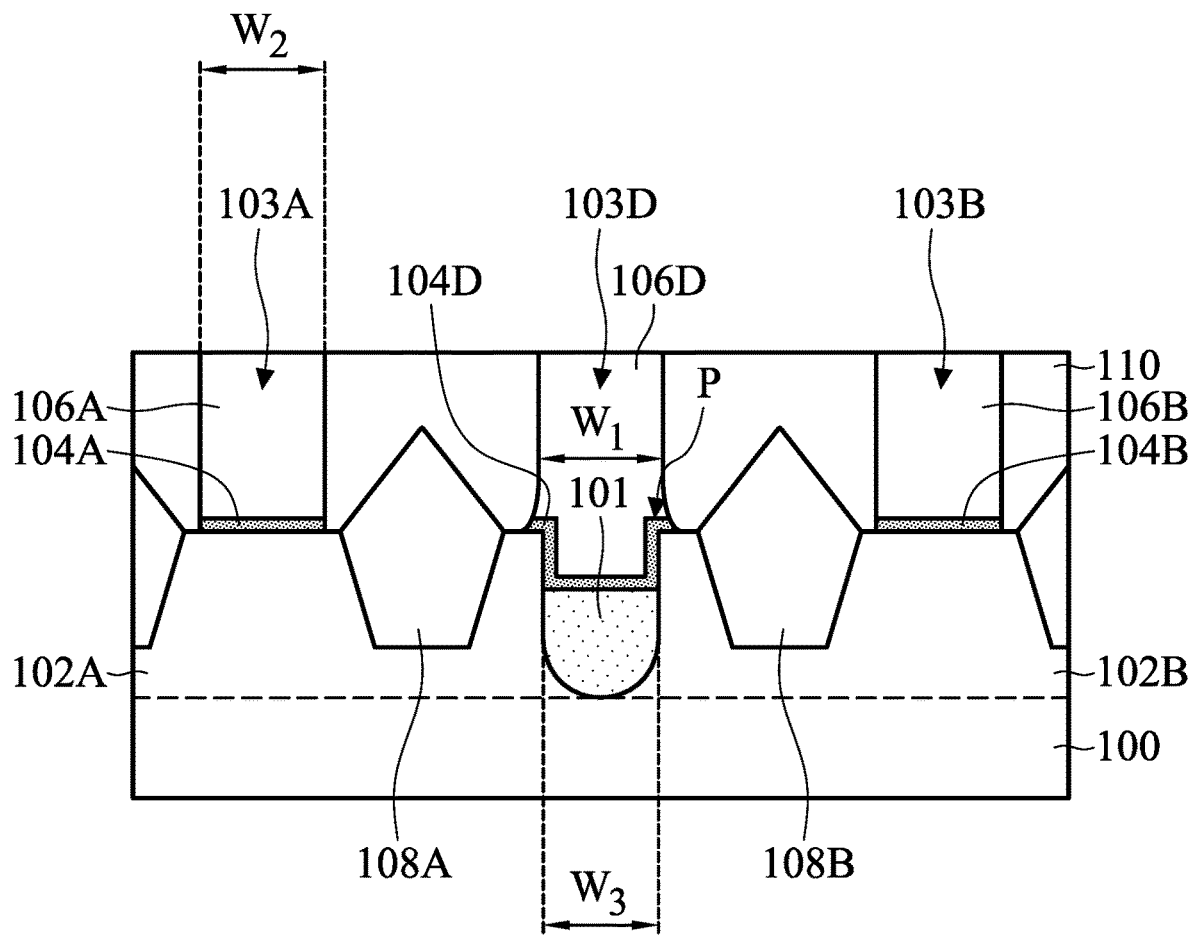

As shown in FIG. 1B, gate stacks 103A and 103B are formed over the fin structures 102A and 102B, in accordance with some embodiments. In some embodiments, the gate stacks 103A and 103B are dummy gate stacks and will be replaced with metal gate stacks in subsequent processes. The gate stacks 103A and 103B may respectively include gate dielectric layers 104A and 104B and gate electrodes 106A and 106B. The gate stacks 103A and 103B covers a portion of the fin structures 102A and 102B, respectively. In some embodiments, a gate stack 103 is formed over the isolation structure 101. The gate stack 103D includes a gate dielectric layer 104D and a gate element 106D. In some embodiments, the materials of the gate dielectric layers 104A, 104B, and 104D are the same. In some embodiments, the materials of the gate electrodes 104A and 104B and the gate element 106D are the same.

As shown in FIG. 1B, the gate stack 103A and 103D have widths $W_2$ and $W_1$, respectively. In some embodiments, the widths $W_2$ and $W_1$ are substantially the same. However, many variations and/or modifications can be made to embodiments of the disclosure. In some other embodiments, the width $W_1$ is greater than the width $W_2$. As shown in FIG. 1B, the isolation structure 101 has a width $W_3$. In some embodiments, the width $W_1$ is greater than the width $W_3$. In some embodiments, the gate stack 103D extends across the isolation structure 101. The gate stack 103D covers two opposite side rails of the isolation structure 101. In some embodiments, the gate stack 103D covers a portion of the fin structure 102A and a portion of the fin structure 102B, as shown in FIG. 1B.

In some embodiments, the gate stacks 103A and 103B have substantially vertical sidewalls. In some embodiments, because the gate stack 103D is formed partially on the isolation structure 101 and partially on the fin structures 102A and 102B, the profile of the gate stack 103D is different from that of the gate stack 103A and 103B. In some embodiments, the lower portion of the gate stack 103D has a footing portion P near the fin structures 102A or 102B, as shown in FIG. 1B. The footing portion P may have a curved surface facing upwards from the fin structures 102A and 102B. The upper portion of the gate stack 103D may have a substantially vertical sidewall that is similar to that of the gate stack 103A or 103B.

In some embodiments, the gate dielectric layers 104A, 104B, and 104D are made of silicon oxide, silicon nitride, silicon oxynitride, another suitable dielectric material, or a combination thereof. In some embodiments, the gate dielectric layers 104A and 104B are dummy gate dielectric layer which will subsequently be removed. In some other embodiments, the gate dielectric layers 104A and 104B are not formed.

In some embodiments, the gate dielectric layers 104A, 104B, and 104D are deposited over the isolation feature 101 and the fin structures 102A and 102B using a chemical vapor deposition (CVD) process, an atomic layer deposition (ALD) process, a thermal oxidation process, a physical vapor deposition (PVD) process, another applicable process, or a combination thereof.

Afterwards, the gate electrodes 106A and 106B and the gate element 106D are formed over the gate dielectric layers 104A, 104B, and 104D, as shown in FIG. 1B in accordance with some embodiments. In some embodiments, the gate electrodes 106A and 106B and the gate element 106D are made of polysilicon. In these cases, the gate element 106D of the gate stack 103D is a polysilicon element.

In some embodiments, a gate electrode layer is deposited over a gate dielectric material layer. The gate electrode layer may be deposited using a CVD process or another applicable process. In some embodiments, the gate electrode layer is made of polysilicon. Afterwards, a patterned hard mask layer (not shown) is formed over the gate electrode layer, in accordance with some embodiments. The patterned hard mask layer is used to pattern the gate electrode layer into one or more gate electrodes including the gate electrodes 106A and 106B and the gate element 106D. One or more etching processes may be used to etch the gate electrode layer through openings of the patterned hard mask layer so as to form the gate stacks 103A, 103B, and 103D.

In some embodiments, spacer elements (not shown) are formed on sidewalls of the gate stacks 103A, 103B, and 103D. The spacer elements may be used to assist in a subsequent formation of source/drain features. In some embodiments, the spacer elements include one or more layers. In some embodiments, the spacer elements are made of a dielectric material. The dielectric material may include silicon nitride, silicon oxide, silicon oxynitride, silicon carbide, another suitable material, or a combination thereof.

In some embodiments, a spacer material layer is deposited over the dummy gate stack using a CVD process, a PVD process, a spin-on process, another applicable process, or a combination thereof. Afterwards, the spacer material layer is partially removed using an etching process, such as an anisotropic etching process. As a result, remaining portions of the spacer material layer on the sidewalls of the gate stacks 103A, 103B, and 103D form the spacer elements.

Afterwards, source/drain features including source/drain features 108A and 108B are formed on the fin structures 102A and 102B, as shown in FIG. 1B in accordance with some embodiments. In some embodiments, the fin structures 102A and 102B not covered by the gate stacks 103A, 103B, and 103D are partially removed to form recesses using, for example, an etching process. Afterwards, source/drain features 108A and 108B are formed in the recesses. In some embodiments, the source/drain features 108A and 108B are epitaxially grown features formed using an epitaxial growth process. In some embodiments, the source/drain features 108A and 108B protrude from the recesses. Due to the gate stack 103D, the growth of the source/drain features 108A and 108B may be controlled better so that the source/drain features 108A and 108B have the desired profiles. In some embodiments, the source/drain features 108A and 108B are also used as stressors that can apply strain or stress on the channel region below the gate stacks 103A and 103B. The carrier mobility may be improved accordingly. In some other embodiments, source/drain features 108A and 108B are doped regions in the fin structures 102A and 102B.

As shown in FIG. 1B, a dielectric layer 110 is then formed to surround the gate stacks 103A, 103B, and 103D, in accordance with some embodiments. In some embodiments, a dielectric material layer is deposited to cover the source/drain features 108A and 108B and the gate stacks 103A, 103B, and 103D. In some embodiments, the dielectric material layer includes silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, a planarization process may be used to partially remove the dielectric material layer. The dielectric material layer may be partially removed until the gate stacks 103A, 103B, and 103D are exposed. As a result, the dielectric layer 110 is formed. In some embodiments, the planarization process includes a CMP process, a grinding process, a dry polishing process, an etching process, another applicable process, or a combination thereof.

Figure 1C:
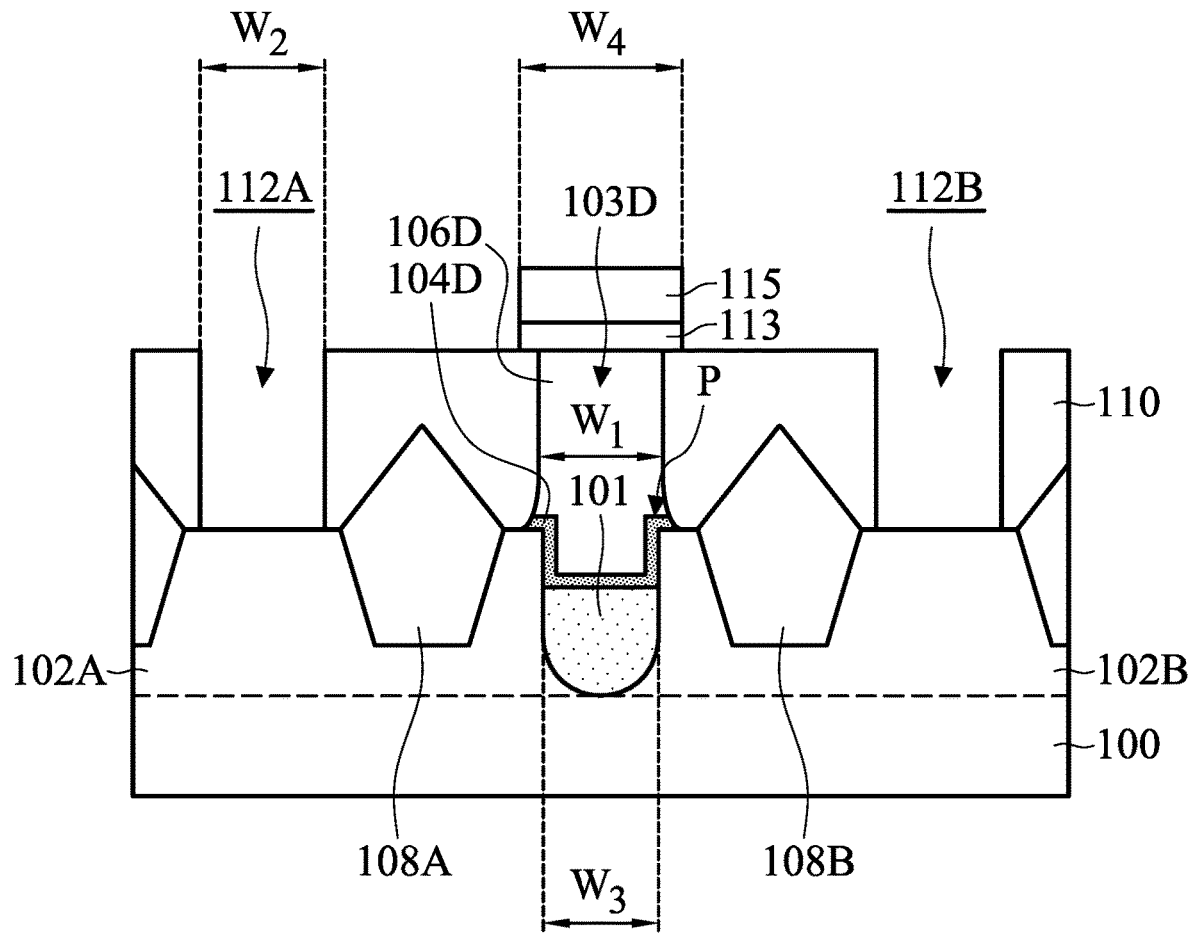

As shown in FIG. 1C, a protection element 115 is formed to cover the gate stack 103D, in accordance with some embodiments. The protection element 115 is used to protect the gate stack 103D from being removed or damaged during a subsequent gate replacement process. The protection element 115 has a width $W_4$. In some embodiments, the width $W_4$ is greater than the width $W_1$ of the gate stack 103D. In some embodiments, because the protection element 115 is wider than the gate stack 103D, the protection element 115 also covers a portion of the dielectric layer 110 that surrounds the gate stack 103D. Therefore, it ensures that the gate stack 103D is well protected.

In some embodiments, the protection element 115 is made of a photoresist material. A photoresist layer may be coated on the dielectric layer 110 and the gate stacks 103A, 103B, and 103D. Afterwards, the photoresist layer may be patterned using a photolithography process to form the protection element 115. In some embodiments, an anti-reflection coating (ARC) layer 113 is formed before the formation of the protection element 115. The ARC layer 113 may be used to assist in the formation of the protection element 115. Many variations and/or modifications can be made to embodiments of the disclosure. In some other embodiments, the protection element 115 is made of silicon nitride. In some other embodiments, the protection element 115 is made of a metal material, a semiconductor material other than polysilicon, a polymer material, another suitable material, or a combination thereof.

After the formation of the protection element 115, the gate stacks 103A and 103B are removed to form recesses 112A and 112B in the dielectric layer 110, as shown in FIG. 1C in accordance with some embodiments. The recesses 112A and 112B expose the fin structures 102A and 102B, respectively. One or more etching processes may be used to form the recesses 112A and 112B.

Figure 1D:
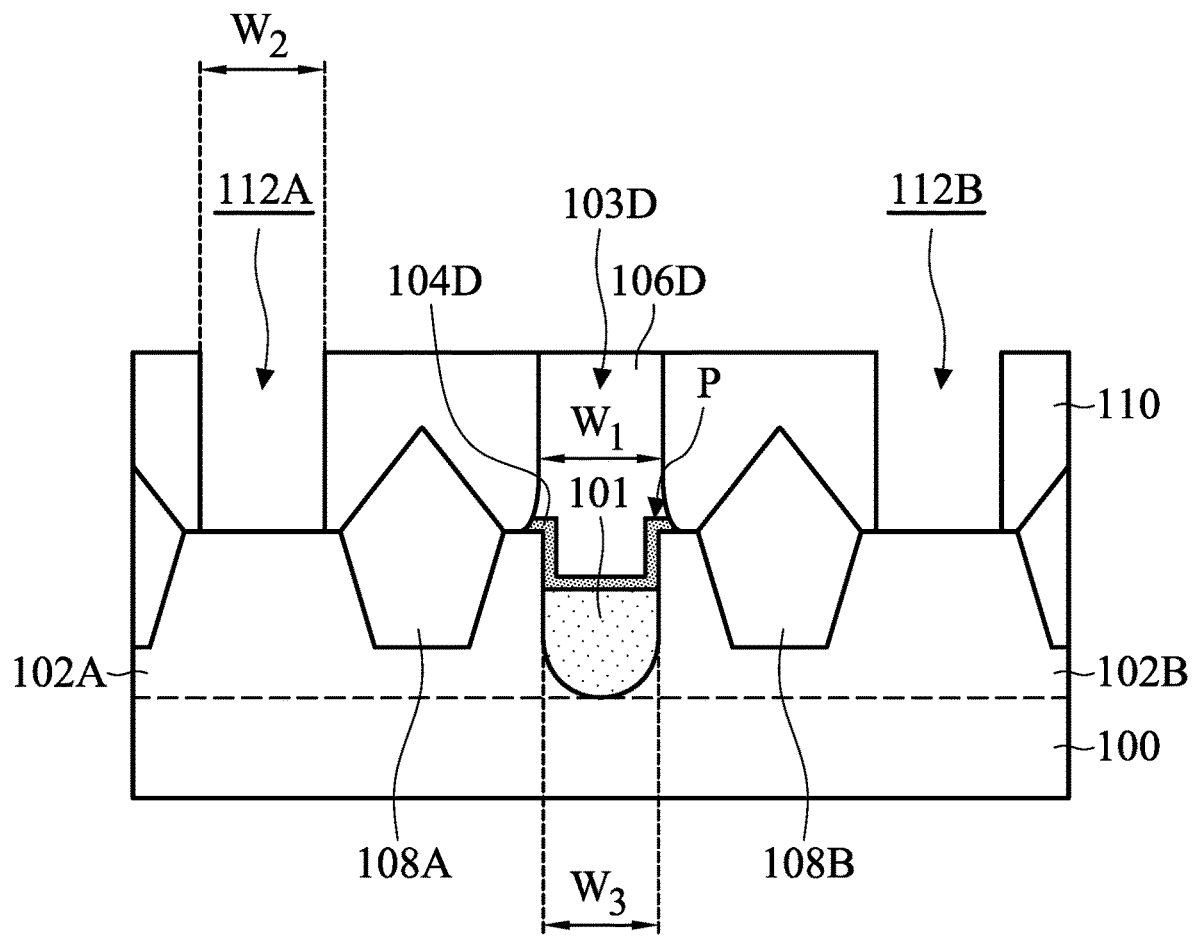
Figure 1E:
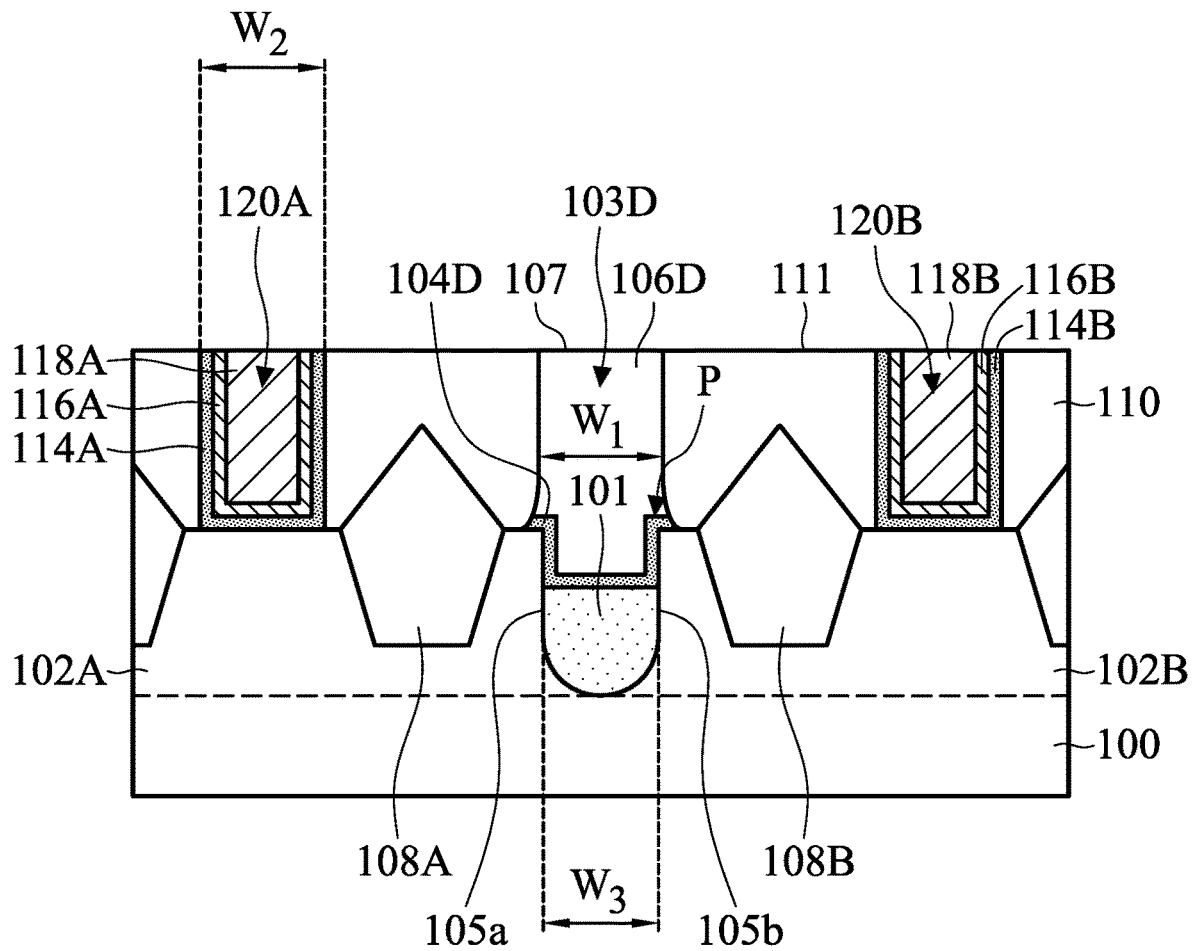

During the etching processes for forming the recesses 112A and 112B, the gate stack 103D is protected by the protection element 115. The gate stack 103D will not be removed to form a recess that might expose the source/drain features 108A and/or 108B. Short circuiting is therefore prevented. Afterwards, the protection element 115 and the ARC layer 113 are removed, as shown in FIG. 1D in accordance with some embodiments.

As shown in FIG. 2E, gate stacks 120A and 120B are respectively formed in the recesses 112A and 112B, in accordance with some embodiments. The gate stacks 120A and 120B may be metal gate stacks. In some embodiments, the gate stack 120A includes a gate dielectric layer 114A, a work function layer 116A, and a conductive filling layer 118A. The work function layer 116A and the conductive filling layer 118A together form a metal electrode. In some embodiments, the gate stack 120B includes a gate dielectric layer 114B, a work function layer 116B, and a conductive filling layer 118B. The work function layer 116B and the conductive filling layer 118B together form a metal electrode.

In some embodiments, the materials of the gate dielectric layer 114A and 114B are the same. In some embodiments, the materials of the conductive filling layers 118A and 118B are the same. In some embodiments, the materials of the work function layers 116A and 116B are the same. In some other embodiments, the materials of the work function layers 116A and 116B are different from each other.

In some embodiments, the gate dielectric layers 114A and 114B are made of a high-K dielectric material. The high-K dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, each of the gate dielectric layers 114A and 114B has a dielectric constant that is greater than that of the gate dielectric layer 104D of the gate stack 103D.

The work function layers 116A and 116B are used to provide the desired work function for transistors to enhance device performance. In some embodiments, the work function layer 116A or 116B is an n-type metal layer capable of providing a work function value suitable for the device, such as equal to or less than about 4.5 eV. In some embodiments, the work function layer 116A or 116B is a p-type metal layer capable of providing a work function value suitable for the device, such as equal to or greater than about 4.8 eV. In some embodiments, the work function layers 116A and 116B are the same type of metal layer, such as the n-type metal layer. In some other embodiments, the work function layers 116A and 116B are different types of metal layers. For example, the work function layer 116A is an n-type metal layer, and the work function layer 116B is a p-type metal layer.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The thickness and/or the compositions of the work function layers 116A and 116B may be fine-tuned to adjust the work function level. For example, a titanium nitride layer may be used as a p-type metal layer or an n-type metal layer, depending on the thickness and/or the compositions of the titanium nitride layer.

In some embodiments, a barrier layer (not shown) is formed between the gate dielectric layer and the work function layer. The barrier layer may be made of titanium nitride, tantalum nitride, another suitable material, or a combination thereof. In some embodiments, a blocking layer (not shown) is formed over the work function layer before the formation of the conductive filling layers 118A and 118B. The blocking layer may be made of tantalum nitride, titanium nitride, another suitable material, or a combination thereof. In some embodiments, the conductive filling layers 118A and 118B are made of aluminum, tungsten, titanium, gold, another suitable material, or a combination thereof.

In some embodiments, multiple layers are formed over the dielectric layer 110 to fill the recesses 112A and 112B. Afterwards, a planarization process is performed to remove the portions of these layers outside of the recesses 112A and 112B. The remaining portions of these layers in the recesses 112A and 112B form the gate stacks 120A and 120B, respectively. In some embodiments, the top surfaces of the gate stacks 120A and 120B are substantially coplanar with a top surface 111 of the dielectric layer 110 after the planarization process. In some embodiments, the top surfaces of the gate stacks 120A and 120B are substantially coplanar with a top surface 107 of the gate stack 103D.

In some embodiments, because the gate stack 103D is protected by the protection element 115 during the gate replacement process for forming the gate stacks 120A and 120B, short circuiting is prevented. In some other cases, no protection element is used and the gate stack 103D is also replaced with a metal gate stack. Short circuiting may be formed between the metal gate stack and the source/drain feature 108A or 108B. In some embodiments, the gate stack 103D is a dummy gate stack. The gate stack 103D does not control a channel region. In some embodiments, there is no conductive contact electrically connected to the gate element 106D of the gate stack 103.

Embodiments of the disclosure form a protection element to cover a gate stack during a gate replacement process of another gate stack. Due to the protection element, the gate stack is not removed during the gate replacement process. Therefore, short circuiting route is prevented from being formed between a source/drain feature and the gate stack. Therefore, the reliability and performance of the semiconductor device structure are significantly improved.

In accordance with some embodiments, a semiconductor device structure is provided. The semiconductor device structure includes a semiconductor substrate and a first gate stack over the semiconductor substrate. The first gate stack includes a metal electrode. The semiconductor device structure also includes a second gate stack over the semiconductor substrate, and the second gate stack includes a polysilicon element.

In accordance with some embodiments, a semiconductor device structure is provided. The semiconductor device structure includes a semiconductor substrate and a first gate stack over the semiconductor substrate. The first gate stack includes a first metal electrode. The semiconductor device structure also includes a second gate stack over the semiconductor substrate, and the second gate stack includes a polysilicon element. The semiconductor device structure further includes a third gate stack over the semiconductor substrate, and the third gate stack includes a second metal electrode. The second gate stack is between the first gate stack and the third gate stack.

In accordance with some embodiments, a method for forming a semiconductor device structure is provided. The method includes forming a first gate stack and a second gate stack over a semiconductor substrate. The method also includes forming a dielectric layer over the semiconductor substrate to surround the first gate stack and the second gate stack. The method further includes forming a protection element to cover the second gate stack. In addition, the method includes replacing the first gate stack with a metal gate stack after the formation of the protection element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first gate stack, a second gate stack, and a third gate stack over a semiconductor substrate, wherein the second gate stack is between the first gate stack and the third gate stack, and the second gate stack comprises a polysilicon element, wherein the second gate stack further comprises a gate dielectric layer between the polysilicon element and the semiconductor substrate, the polysilicon element is formed to have a footing portion with a curved surface facing upwards, the footing portion is a continuous part of the polysilicon element, the gate dielectric layer is formed to have a curved sidewall surface extending upward from a fin structure and ending at the curved surface of the polysilicon element of the second gate stack;
   forming a dielectric layer over the semiconductor substrate to surround the first gate stack, the second gate stack, and the third gate stack;
   forming a protection element to cover the second gate stack, wherein the protection element extends across an edge of the second gate stack, and an entirety of the protection element is above the second gate stack; and
   simultaneously and respectively replacing the first gate stack and the third gate stack with a first metal gate stack and a second metal gate stack after the formation of the protection element.

2. The method for forming a semiconductor device structure as claimed in claim 1, further comprising forming a fin structure over the semiconductor substrate before the formation of the first gate stack, wherein the first gate stack covers a portion of the fin structure.

3. The method for forming a semiconductor device structure as claimed in claim 2, further comprising forming an isolation structure over the semiconductor substrate such that the isolation structure is adjacent to the fin structure before the formation of the second gate stack, wherein the second gate stack covers the isolation structure.

4. The method for forming a semiconductor device structure as claimed in claim 3, wherein a top surface of the isolation structure is lower than a top of the fin structure and higher than a bottom of the fin structure, and the second gate stack covers a sidewall of the fin structure.

5. The method for forming a semiconductor device structure as claimed in claim 1, wherein the protection element is wider than the second gate stack.

6. The method for forming a semiconductor device structure as claimed in claim 5, wherein the protection element is made of a photoresist material.

7. The method for forming a semiconductor device structure as claimed in claim 5, wherein the protection element comprises a metal material, a semiconductor material other than polysilicon, a polymer material, or a combination thereof.

8. The method for forming a semiconductor device structure as claimed in claim 1, further comprising:
   removing the first gate stack to form a recess in the dielectric layer after the formation of the protection element;
   removing the protection element after the formation of the recess; and
   forming the first metal gate stack in the recess after the protection element is removed.

9. The method for forming a semiconductor device structure as claimed in claim 1, wherein the second gate stack and the first gate stack are formed to be as wide as each other.

10. A method for forming a semiconductor device structure, comprising:
   forming a fin structure over a semiconductor substrate;
   forming a first gate stack and a second gate stack over the fin structure, wherein the second gate stack comprises a polysilicon element and a gate dielectric layer between the polysilicon element and the fin structure, the polysilicon element is formed to have a footing portion with a curved surface facing upwards, the footing portion is a continuous part of the polysilicon element, the gate dielectric layer is formed to have a curved sidewall surface extending upward from the fin structure and ending at the curved surface of the polysilicon element of the second gate stack;
   forming a third gate stack over the semiconductor substrate, wherein the second gate stack is between the first gate stack and the third gate stack;
   forming a dielectric layer over the semiconductor substrate to surround the first gate stack, the second gate stack, and the third gate stack;
   forming a protection element to cover the second gate stack;
   simultaneously and respectively replacing the first gate stack and the third gate stack with a first metal gate stack and a second metal gate stack after the formation of the protection element; and
   removing the protection element before forming the first metal gate stack and the second metal gate stack.

11. The method for forming a semiconductor device structure as claimed in claim 10, wherein the protection element is formed to completely cover a top surface of the second gate stack.

12. The method for forming a semiconductor device structure as claimed in claim 10, further comprising forming an isolation structure adjacent to the fin structure, wherein the second gate stack is formed directly above the isolation structure.

13. The method for forming a semiconductor device structure as claimed in claim 10, wherein the protection element is in direct contact with the dielectric layer.

14. A method for forming a semiconductor device structure, comprising:
   forming a first fin structure and a second fin structure over a semiconductor substrate;
   forming a first gate stack over the first fin structure, wherein the first gate stack comprises a gate electrode;
   forming a second gate stack over a gap between the first fin structure and the second fin structure, wherein the second gate stack comprises a gate element, and the gate electrode and the gate element are made of the same material;
   forming a third gate stack over the second fin structure, wherein the second gate stack is between the first gate stack and the third gate stack;
   forming a dielectric layer over the semiconductor substrate to surround the first gate stack, the second gate stack, and the third gate stack, wherein the dielectric layer is as high as at least one of the first gate stack, the second gate stack, and the third gate stack;
   forming a protection element to cover the second gate stack and a portion of the dielectric layer;
   removing the first gate stack and the third gate stack to form a first recess and a second recess while the second gate stack is covered by the protection element; and
   respectively forming a first metal gate stack and a second metal gate stack in the first recess and the second recess while the second gate stack extends across the gap.

15. The method for forming a semiconductor device structure as claimed in claim 14, further comprising forming a source/drain feature over the first fin structure before the dielectric layer is formed.

16. The method for forming a semiconductor device structure as claimed in claim 14, wherein protection element is a patterned photoresist.

17. The method for forming a semiconductor device structure as claimed in claim 14, further comprising forming an isolation structure in the gap before the first gate stack and the second gate stack are formed.

18. The method for forming a semiconductor device structure as claimed in claim 14, wherein the second gate stack are formed to partially cover the first fin structure and to partially cover the second fin structure.

19. The method for forming a semiconductor device structure as claimed in claim 14, wherein the gate element is formed to have a footing portion with a curved surface facing upwards, the footing portion is a continuous part of the gate element.

20. The method for forming a semiconductor device structure as claimed in claim 19, wherein the gate element comprises polysilicon.

* * * * *